(12) United States Patent
Ramkumar et al.

(10) Patent No.: US 8,993,400 B1
(45) Date of Patent: Mar. 31, 2015

(54) DEUTERATED FILM ENCAPSULATION OF NONVOLATILE CHARGE TRAP MEMORY DEVICE

(71) Applicant: Cypress Semiconductor Corporation, San Jose, CA (US)

(72) Inventors: Krishnaswamy Ramkumar, San Jose, CA (US); Fredrick B. Jenne, Mountain House, CA (US); William C. Koutny, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/029,500

(22) Filed: Sep. 17, 2013

Related U.S. Application Data

(63) Continuation of application No. 11/904,474, filed on Sep. 26, 2007, now Pat. No. 8,536,640.

(60) Provisional application No. 60/951,154, filed on Jul. 20, 2007.

(51) Int. Cl.
*H01L 21/336* (2006.01)
*H01L 29/66* (2006.01)

(52) U.S. Cl.
CPC .................. *H01L 29/66833* (2013.01)
USPC .......................................................... 438/287

(58) Field of Classification Search
CPC ............ H01L 29/792; H01L 29/66833; H01L 29/7926; H01L 21/28282; H01L 23/3171; H01L 23/293; H01L 23/3121; H01L 23/42324
USPC ..................... 257/66, 316, 325; 438/264, 287
See application file for complete search history.

(56) References Cited

U.S. PATENT DOCUMENTS

| | | | |
|---|---|---|---|
| 5,972,765 A | 10/1999 | Clark et al. | |
| 6,023,093 A | 2/2000 | Gregor et al. | |
| 6,114,734 A * | 9/2000 | Eklund | 257/410 |
| 6,140,187 A | 10/2000 | Debusk et al. | |
| 6,147,014 A | 11/2000 | Lyding et al. | |
| 6,661,065 B2 | 12/2003 | Kunikiyo | |
| 6,677,213 B1 * | 1/2004 | Ramkumar et al. | 438/308 |
| 6,686,242 B2 | 2/2004 | Willer et al. | |
| 7,042,054 B1 | 5/2006 | Ramkumar et al. | |
| 2001/0044186 A1 * | 11/2001 | Reinberg | 438/264 |
| 2002/0072187 A1 * | 6/2002 | Chetlur et al. | 438/359 |
| 2002/0074622 A1 * | 6/2002 | Weimer et al. | 257/626 |
| 2002/0076576 A1 * | 6/2002 | Li et al. | 428/690 |
| 2002/0140043 A1 * | 10/2002 | Mitani et al. | 257/410 |
| 2002/0168841 A1 * | 11/2002 | Chetlur et al. | 438/585 |
| 2005/0003680 A1 * | 1/2005 | Weimer et al. | 438/778 |
| 2006/0079046 A1 * | 4/2006 | Yang et al. | 438/199 |

(Continued)

OTHER PUBLICATIONS

U.S. Appl. No. 11/904,474: "Deuterated Film Encapsulation of Nonvolatile Charge Trap Memory Device" Krishnaswamy Ramkumar et al., filed Sep. 26, 2007; 41 pages.

(Continued)

*Primary Examiner* — Vongsavanh Sengdara

(57) ABSTRACT

A nonvolatile charge trap memory device with deuterium passivation of charge traps and method of manufacture. Deuterated gate layer, deuterated gate cap layer and deuterated spacers are employed in various combinations to encapsulate the device with deuterium sources proximate to the interfaces within the gate stack and on the surface of the gate stack where traps may be present.

20 Claims, 13 Drawing Sheets

(56) References Cited

U.S. PATENT DOCUMENTS

2006/0084242 A1* 4/2006 Wang .............................. 438/475
2006/0198190 A1* 9/2006 Lue ........................... 365/185.12

OTHER PUBLICATIONS

Application No. PCT/US07/20954: "Deuterated Film Encapsulation of Nonvolatile Charge Trap Memory Device" filed on Sep. 28, 2007; 36 pages.
International Search Report for International Application No. PCT/US07/20954 dated Apr. 21, 2008; 2 pages.
Requirement Restriction for U.S. Appl. No. 11/904,474 dated May 26, 2009; 9 pages.
SIPO 2 Month Office Action for Application No. 200780035964.8 dated Sep. 21, 2011; 4 pages.
SIPO 4 Month Office Action for Application No. 200780035964.8 dated Mar. 29, 2011; 4 pages.
TIPO 2 Month Office Action for Application No. 096136683 dated Jul. 28, 2013; 5 pages.
USPTO Advisory Action for U.S. Appl. No. 11/904,474 dated Jul. 27, 2010; 3 pages.
USPTO Final Rejection for U.S. Appl. No. 11/904,474 dated May 11, 2010; 22 pages.
USPTO Non Final Rejection for U.S. Appl. No. 11/904,474 dated Feb. 13, 2013; 17 pages.
USPTO Non-Final Rejection for U.S. Appl. No. 11/904,474 dated Nov. 2, 2009; 22 pages.
USPTO Notice of Allowance for U.S. Appl. No. 10/094,108 dated Aug. 22, 2003; 5 pages.
USPTO Notice of Allowance for U.S. Appl. No. 11/904,474 dated May 1, 2013; 10 pages.
Written Opinion of the International Searching Authority for International Application No. PCT/US2007/020954 mailed Apr. 21, 2008; 4 pages.

* cited by examiner

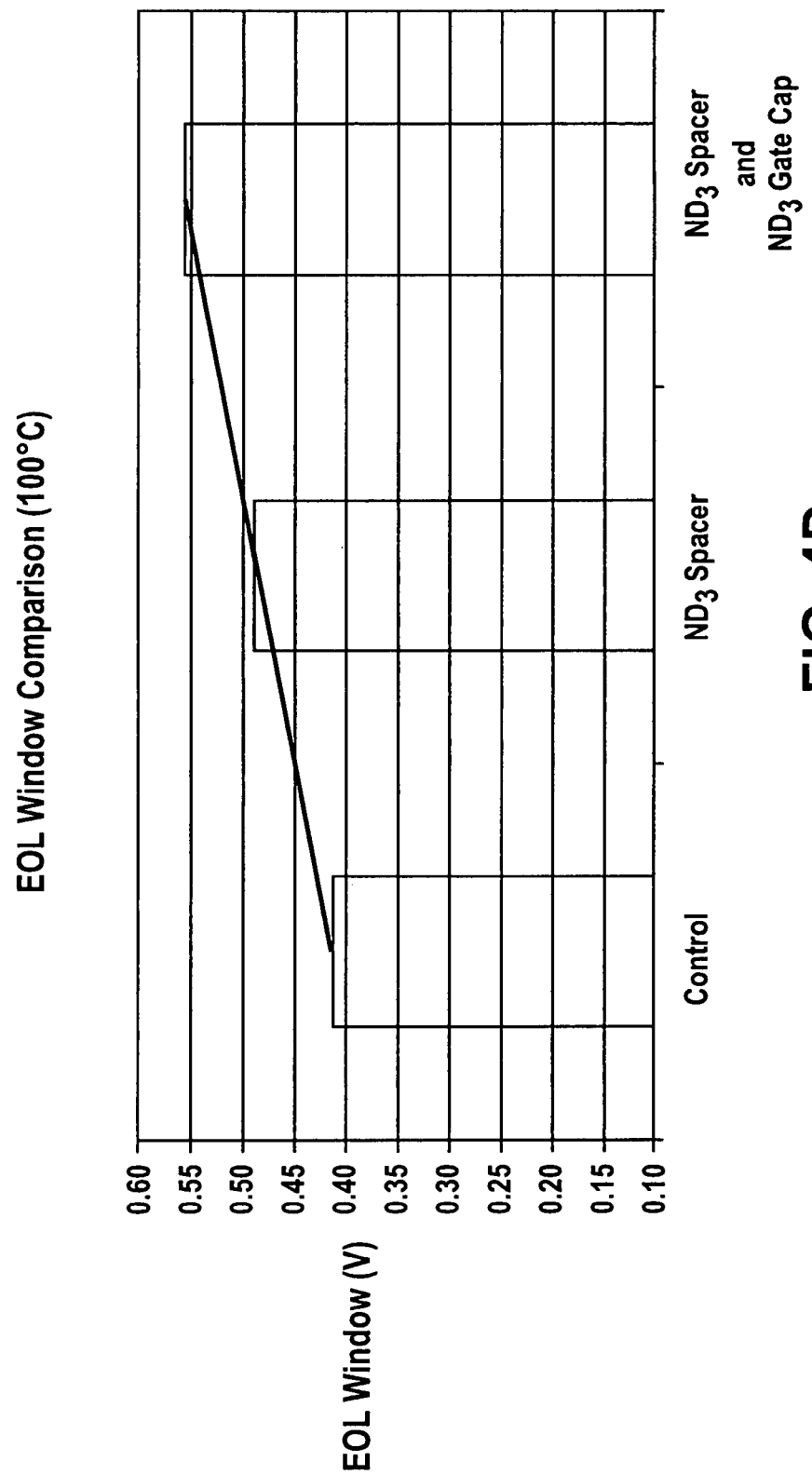

DEUTERATED FILM ENCAPSULATION OF NONVOLATILE CHARGE TRAP MEMORY DEVICE

CROSS REFERENCE TO RELATED APPLICATIONS

This application claims priority to and benefit of U.S. application Ser. No. 11/904,474, filed on Sep. 26, 2007, now U.S. Pat. No. 8,536,640, which claims the benefit of U.S. Provisional Application No. 60/951,154, filed Jul. 20, 2007, both of which are hereby incorporated by reference.

TECHNICAL FIELD

Embodiments of the present invention relate to the electronics manufacturing industry and more particularly to fabrication of nonvolatile charge trap memory devices.

BACKGROUND

The plurality of interfaces of a non-volatile charge trap memory device, such as an oxide-silicon interface in a semiconductor-oxide-nitride-oxide-semiconductor (SONOS) type structure, are susceptible to dangling bonds forming interface traps. These interface traps readily accept mobile carriers (electrons or holes) causing a variety of problems, such as shifts in the threshold voltage ($V_t$) of the device or breakdown of an insulator layer, such as a tunneling oxide layer in a SONOS device. In addition, a build-up of mobile carriers may increase the back tunneling current of non-volatile charge trap semiconductor memory cells, thereby dissipating the memory of the stored data more quickly. Consequently, the presence of interface traps may degrade the long-term retention of non-volatile memory cells.

FIG. 1 is a partial cross-sectional view of an intermediate structure for a SONOS semiconductor memory device 10 having a gate stack 28 formed over a substrate 12. In addition, the device 10 typically further includes one or more diffusion regions, such as source and drain regions 26, aligned to the gate stack and separated by a channel region of the substrate 12 below the ONO stack 20. As further shown, device 10 may further include oxide sidewall spacers 24 along the sidewalls of the gate stack 28. Finally, a nitride interlayer dielectric (ILD) 36 may be deposited over the device 10 along with subsequent (ILD) 38.

Briefly, the SONOS gate stack 28 typically includes a poly-silicon (poly) gate layer 22 formed upon and in contact with the ONO stack 20 and thereby separated or electrically isolated from the substrate 12. The ONO stack 20 generally includes a tunnel oxide 14, a charge trapping nitride 16 serving as a memory layer for the device 10 and a blocking oxide 18 overlying the charge trapping nitride 16. In some cases, interface traps within fabricated devices may be passivated such that the build-up of mobile carriers are reduced or eliminated for an amount of time, thereby theoretically improving device reliability. In particular, the dangling bonds within an oxide-silicon interface may be bonded to atomic hydrogen (H) or deuterium (D), removing the interface trap and allowing the device to operate for a longer period of time.

In certain conventionally passivated memory devices, such as that shown in FIG. 1, atomic hydrogen or deuterium may be introduced during an anneal in molecular hydrogen ($H_2$) or deuterium ($D_2$) to passivate interface traps. However, such a conventional technique may present problems affecting the functionality and reliability of the devices. In particular, such anneal processes typically require the use of "pure" hydrogen or deuterium, which is free or substantially absent of other elements. Typically, free hydrogen and free deuterium include safety hazards, which make them difficult to incorporate into semiconductor fabrication processes. Furthermore, the temperature required for deuterium anneals, is typically between 500 degrees Celsius (° C.) and 700° C. Such a high temperature along with a typical annealing duration of between approximately 4 to 5 hours may undesirably increase the thermal budget of an advanced fabrication process, degrading the functionality of device 10. In addition, deuterium cannot readily diffuse through nitride. Consequently, the use of a deuterium anneal in devices, which include nitride layers, such as SONOS devices, are limited in their capability to improve device reliability.

Accordingly, there remains a need to provide a deuterium source to passivate a semiconductor device, such as a SONOS device, in a manner compatible with advanced semiconductor fabrication techniques.

BRIEF DESCRIPTION OF THE DRAWINGS

Embodiments of the present invention are illustrated by way of example, and not limitation, in the figures of the accompanying drawings in which:

FIG. 4D provides end of life (EOL) window performance for various treatments including a SONOS device having a deuterated gate cap layer and a SONOS device having a deuterated gate cap layer and a deuterated gate stack sidewall spacers according an embodiment of the present invention.

DETAILED DESCRIPTION

Figure 1:
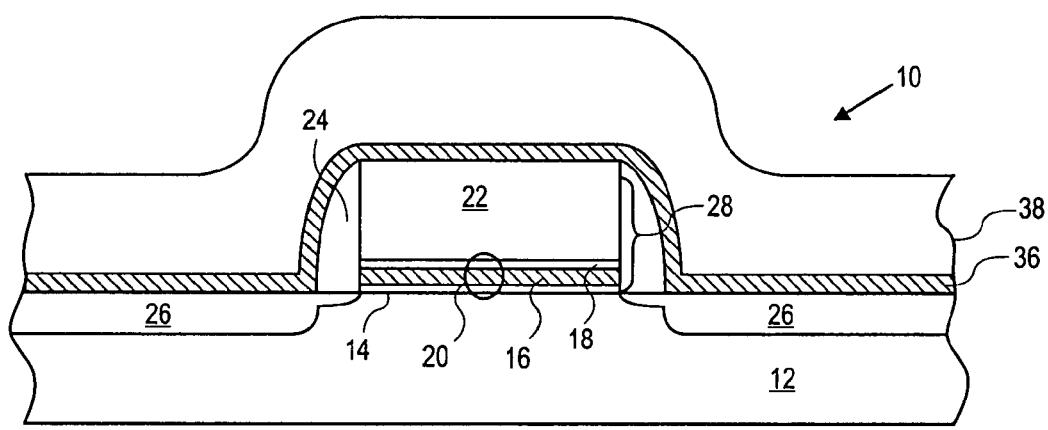
FIG. 1 illustrates a cross sectional side view of an intermediate structure of a conventional SONOS device.

Embodiments of passivating a nonvolatile charge trap memory device are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

An embodiment of the present invention include a nonvolatile charge trap memory device incorporating a passivating hydrogen isotope, such as deuterium (D), into layers within or immediately surrounding the semiconductor device gate stack rather than within subsequent ILD layers. In accordance with one embodiment of the present invention, the nonvolatile charge trap memory device is a SONOS-type device wherein the charge-trapping layer is an insulator layer, such as a nitride. In another embodiment, the semiconductor device is a floating gate Flash-type device wherein the charge-trapping layer is a conductor layer or a semiconductor layer, such as poly-silicon. For a SONOS-type device, the incorporation of the deuterium passivating species, as described herein, has as one benefit, increased retention time.

Generally, a passivating hydrogen isotope, such as deuterium, is incorporated during deposition of the particular layers by employing a deposition precursor gas which replaces hydrogen with deuterium. Exemplary precursor gases include deuterated ammonia ($ND_3$) and deuterated silane ($SiD_4$). Such gases are commercially available in high grade with a high percentage of deuterium (e.g. greater than 90%). Upon formation of the deuterated layers within or surrounding the semiconductor device gate stack, thermal cycles diffuse the deuterium passivating species to passivate traps at interfaces, such as the silicon (Si)-silicon oxide (SiO) interfaces of a SONOS-type device and the silicon nitride (SiN)-silicon oxide (SiO) interfaces of a SONOS-type device. The hydrogen isotope is dislodged less easily than lower mass hydrogen species as the semiconductor device cycles and ages. While the deuterium isotope is particularly advantageous for long term device passivation and therefore routinely referred to herein, it should be appreciated other applications, such as those requiring passivation over shorter time periods, may similarly incorporate the tritium isotope (T).

As described herein, a "deuterated" layer is a layer which contains a concentration of deuterium "as deposited" in contrast with a layer substantially free of deuterium species when formed. References herein to deuterated layers formed of materials containing deuterium "as-deposited" are to be understood as distinct from those films which may have deuterium merely as a result of diffusion of deuterium into the layers from an external source of deuterium, such as a subsequently deposited deuterated interlayer dielectric (ILD) layer or a molecular deuterium anneal. Deuterated layers containing a concentration of deuterium as-deposited have configurable deuterium concentration profiles in contrast to a layer which comprises deuterium as a result of diffusion of deuterium from an external source. When deuterium is diffused into a layer from an external source (such as from a deuterated ILD layer), the deuterium concentration in the layer is graded (such as the lowest deuterium concentration nearest the gate stack interface and the highest deuterium concentration nearest the deuterium source (e.g. nearest an overlying deuterated ILD layer). In contrast, the deuterated layers disclosed herein containing deuterium as-deposited may provide a relatively higher deuterium concentration at the interface between the layer and the gate stack as well as a deuterium concentration profile that is configurable to be other than that dictated by diffusion processes. In one such embodiment, the deuterated layer has a substantially uniform deuterium concentration profile throughout the thickness of the layer. In another such embodiment, the deuterated layer has a highest deuterium concentration profile proximate to a blocking oxide and lowest proximate an overlying ILD layer.

FIG. 2A, FIG. 2B, FIG. 2C and FIG. 2D each illustrate a cross-sectional side view of an intermediate structure of a SONOS device according to a particular embodiment of the present invention. In one embodiment, substrate 212 is a bulk substrate comprised of a single crystal of a material which may include, but is not limited to, silicon, germanium, silicon/germanium or a III-V compound semiconductor material. In another embodiment, substrate 212 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, substrate 212 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxynitride. The lower bulk layer is comprised of a single crystal which may include, but is not limited to, silicon, germanium, silicon/germanium, a III-V compound semiconductor material and quartz. Substrate 212 and, hence, the channel region between the source and drain regions 226, may comprise dopant impurity atoms. In a specific embodiment, the channel region is doped P-type and, in an alternative embodiment, the channel region is doped N-type.

Source and drain regions 226 in substrate 212 may be any regions having opposite conductivity to the channel region. For example, in accordance with an embodiment of the present invention, source and drain regions 226 are N-type doped while channel region of substrate 212 is P-type doped. In one embodiment, substrate 212 is comprised of boron-doped single-crystal silicon having a boron concentration in the range of $1 \times 10^{15}$-$1 \times 10^{19}$ atoms/cm$^3$. Source and drain regions 110 are comprised of phosphorous- or arsenic-doped regions having a concentration of N-type dopants in the range of $5 \times 10^{16}$-$1 \times 10^{20}$ atoms/cm$^3$. In a specific embodiment, source and drain regions 226 have a depth in substrate 212 in the range of 80-200 nanometers. In accordance with an alternative embodiment of the present invention, source and drain regions 226 are P-type doped while the channel region of substrate 212 is N-type doped.

The SONOS devices of FIGS. 2A-2D further include over substrate 212 an ONO stack 220 including a tunneling layer 214, a trapping layer 216 and a blocking layer 218. The tunneling layer 214 may be any material and have any thickness allowing charge carriers to tunnel into the charge-trapping layer under a high gate bias condition while maintaining a suitable barrier to leakage under conditions of low gate bias. In certain embodiments, tunneling layer 214 is a commonly known dielectric layer, such as silicon dioxide ($SiO_2$), a silicon oxynitride ($SiO_xN_y(H_z)$) or a silicon dioxide that is subsequently nitridized, or a stack dielectric made of Silicon dioxide and silicon nitride or silicon oxynitride, having a physical thickness of between about 1.5 nm and 3.0 nm. In another embodiment, tunneling layer 214 is comprised of a dielectric layer having a dielectric constant greater than that of silicon nitride which may include, but is not limited to, hafnium oxide, zirconium oxide, hafnium silicate, hafnium oxy-nitride, hafnium zirconium oxide and lanthanum oxide.

The trapping layer 216 of the SONOS devices in FIGS. 2A-2D may further include any commonly known charge trapping material and have any thickness suitable to store charge and, modulate the threshold voltage of the devices. In certain embodiments trapping layer 216 is silicon nitride ($Si_3N_4$), silicon-rich silicon nitride, or silicon oxynitride. In one particular embodiment, the trapping layer 216 has a non-uniform stoichiometry across the thickness of trapping layer. For example, the trapping layer 216 may further include at least two oxynitride layers having differing compositions of silicon, oxygen and nitrogen. In one particular embodiment, a bottom oxynitride within trapping layer 216 has a first composition with a high silicon concentration, a high oxygen concentration and a low nitrogen concentration to provide an oxygen-rich oxynitride. This first oxynitride may have a physical thickness between 2.5 nm and 4.0 nm corresponding to an EOT of between 1.5 nm and 5.0 nm. The trapping layer 216 may further include a top oxynitride with a high silicon concentration, a high nitrogen concentration and a low oxygen concentration to produce a silicon-rich oxynitride. This second oxynitride may have a physical thickness of 4.0 to 6.0 nm for a trapping layer 216 with a net physical thickness of 9 to 11 nm.

Completing the ONO stack 220, the blocking layer 218 of the SONOS devices depicted in FIGS. 2A-2D may be any commonly known material with any thickness suitable to maintain a barrier to charge leakage without significantly decreasing the capacitance of gate stack. In one embodiment, blocking layer 218 comprises a high-k dielectric layer which may include, but is not limited to, hafnium oxide, zirconium oxide, hafnium silicate, hafnium oxy-nitride, hafnium zirconium oxide and lanthanum oxide. In another embodiment, the blocking layer 218 is silicon dioxide or silicon oxynitride or a silicon dioxide and silicon nitride stack with a physical thickness between about 3.0 nm and about 5.0 nm.

A further depicted in FIGS. 2A-2D, the gate stack includes a gate layer 222 over the ONO stack 220. The gate layer may be any conductor or semiconductor material. In one such embodiment, the gate layer 222 is poly-silicon (poly). In another embodiment, the gate layer 222 contains a metal, such as, but not limited to, hafnium, zirconium, titanium, tantalum, aluminum, ruthenium, palladium, platinum, cobalt and nickel, their silicides, their nitrides and their carbides. In one particular embodiment, the gate layer 222 is poly-silicon having a physical thickness of between 70 nm and 250 nm.

Figure 2A:
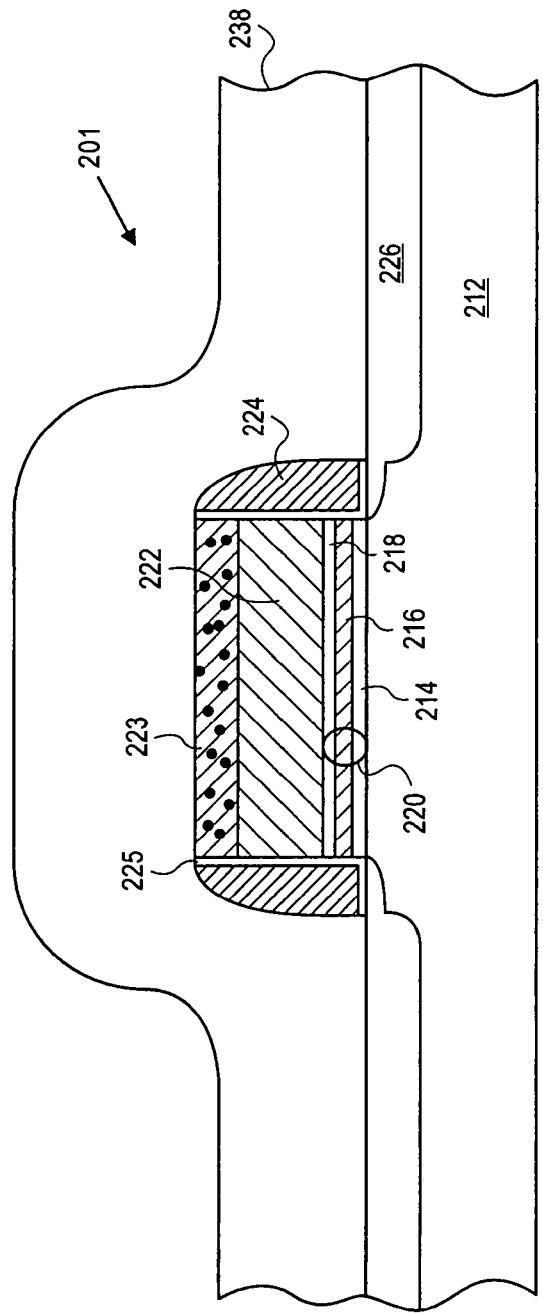
FIG. 2A illustrates a cross-sectional side view of intermediate structure of a semiconductor device having an ONO structure including a deuterated gate cap layer according to an embodiment of the present invention
Figure 2B:
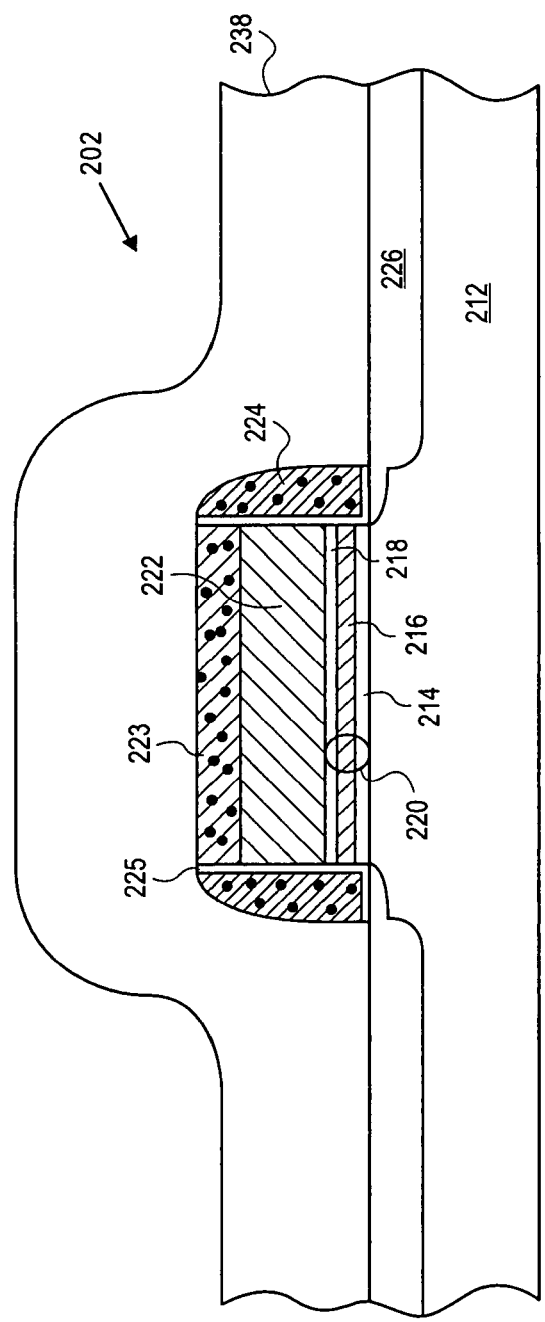
FIG. 2B illustrates a cross-sectional side view of intermediate structure of a semiconductor device having an ONO structure including a deuterated gate cap layer and deuterated gate stack sidewall spacers according to an embodiment of the present invention
Figure 2C:
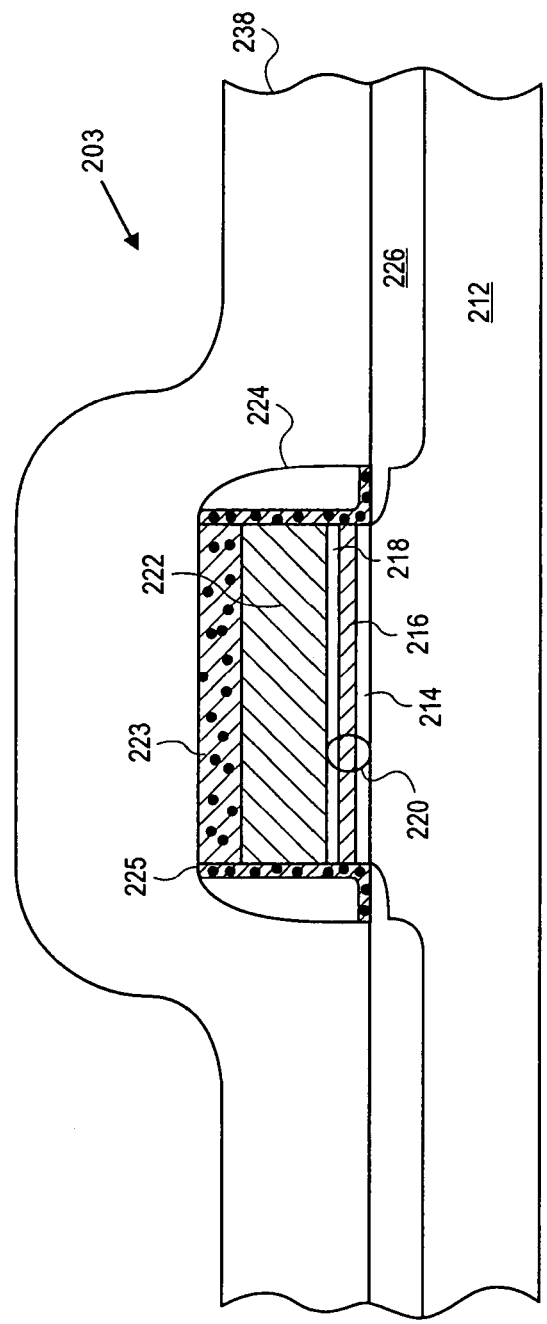
FIG. 2C illustrates a cross-sectional side view of intermediate structure of a semiconductor device having an ONO structure including a deuterated gate cap layer and deuterated gate stack sidewall spacers according to an embodiment of the present invention.
Figure 2D:
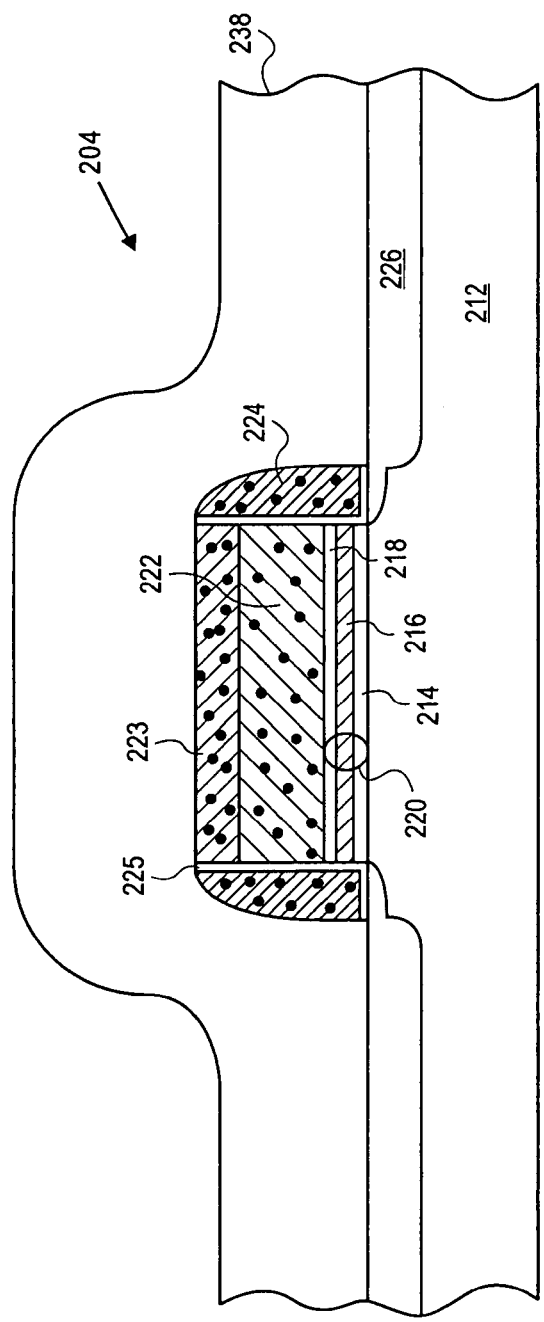
FIG. 2D illustrates a cross-sectional side view of intermediate structure of a semiconductor device having an ONO structure including a deuterated gate layer, a deuterated gate cap layer and deuterated gate stack sidewall spacers according to an embodiment of the present invention.

In an embodiment, such as that shown in FIG. 2D, the gate layer 222 is deuterated to have a concentration of deuterium greater than any layer in the ONO stack 220. In one such embodiment, the gate layer 222 is deuterated poly-silicon. In further embodiments, the gate layer 222 has a gradient of deuterium species across its physical thickness, wherein the concentration of deuterium is relatively higher near the interface with the blocking layer 218 than near the interface with the gate cap layer 223.

In one embodiment, a gate cap layer of a nonvolatile charge trap memory device includes a concentration of deuterium as deposited. As shown in FIGS. 2A-2D, the gate cap layer 223 is super adjacent to the gate layer 222 and has approximately the same critical dimensions as the gate layer 222 and ONO stack 220. In certain embodiments, the gate cap layer 223 forms the top layer of the gate stack and provides a hard mask during patterning of the gate layer 222 and ONO stack 220. In some embodiments, the gate cap layer 223 facilitates formation of self aligned contacts (SAC) to the SONOS devices. The gate cap layer 223 is a deuterated material to provide a source of deuterium for passivating the interfaces in the gate stack below the gate cap layer 223. Traps at the interface between a blocking layer 218 and a trapping layer 216, traps at the interface between a trapping layer 216 and a tunneling layer 214, and traps at the interface between a tunneling layer 214 and a semiconductor substrate 212 may each be passivated.

In particular embodiments, the gate cap layer 223 is a deuterated silicon nitride or deuterated silicon oxynitride. In certain embodiments, the gate cap layer 223 is deuterated silicon nitride having a physical thickness of between 150 nm and 200 nm is employed in SONOS device 210. In further embodiments, the deuterium concentration across the physical thickness of the gate cap layer 223 is substantially uniform. In an alternative embodiment, the deuterium concentration across the physical thickness of the gate cap layer 223 is higher at the interface with the gate layer 222 than at the interface with the ILD 238. In still another embodiment, the gate cap layer 223 contains a higher concentration of deuterium than does a deuterated gate layer. In another embodiment, the deuterium concentration in the gate cap layer 223 is higher than in a overlying ILD layer 238. In a further embodiment, the deuterium concentration the gate cap layer 223 is higher than in the charge-trapping layer 216. In still another embodiment, the deuterium concentration the gate cap layer 223 is higher than both the ILD 238 and the charge-trapping layer 216.

In other embodiments, such as those depicted in FIGS. 2B, 2C and 2D, gate stack sidewall spacers of a nonvolatile charge trap memory device contain a concentration of deuterium as deposited. The deuterated gate stack sidewall spacers may also serve as a source of diffusible deuterium for passivating the interface traps throughout the interfaces of the gate stack. Furthermore, in such embodiments, traps at the interface of the gate stack sidewall and the gate stack sidewall spacer may also be passivated by deuterium species diffusing from the deuterated gate stack sidewall spacers. This may be particularly advantageous to limit the surface leakage of a gate stack.

In one embodiment, a multi-layer deuterated spacer including at least a first and second dielectric layer contains a concentration of deuterium as-deposited in at least one of the dielectric layers. In the particular embodiment depicted in FIG. 2B, SONOS device 203 includes a multi-layer gate stack sidewall spacer having a spacer liner 225 in contact with a gate stack sidewall and on the spacer liner 225 is a spacer layer 224 that is deuterated. Spacer liner 225 may be any commonly employed dielectric such as but not limited to silicon dioxide, silicon oxynitride and silicon nitride. In one embodiment, the spacer layer 224 is deuterated silicon nitride or deuterated oxynitride. In one such embodiment, the spacer liner 225 and spacer layer 224 combine for a lateral width of between 50 nm and 80 nm separating the gate stack from source drain regions 226. In one embodiment, the spacer layer 224 has a substantially uniform deuterium concentration throughout its thickness. In a particular embodiment, the deuterium concentration in spacer layer 224 is higher than in the overlying ILD 238. In a further embodiment, the deuterium concentration in the spacer layer 224 is higher than in the charge-trapping layer 216. In still another embodiment, the deuterium concentration in the spacer layer 224 is higher than both the ILD 238 and the charge-trapping layer 216. In other embodiments, the deuterium concentration throughout the thickness of the spacer layer 224 is predetermined to have a particular gradient by varying the deuterium concentration during deposition.

In an alternative embodiment depicted in FIG. 2C, SONOS device 203 includes a multi-layer gate stack sidewall spacer having a spacer liner 225 that is deuterated and a second spacer layer 224 that is non-deuterated. In one such embodiment, the spacer liner 225 may be deuterated silicon nitride or deuterated oxynitride while the spacer layer 224 is any commonly employed non-deuterated dielectric such as silicon dioxide, silicon nitride or silicon oxynitride. As illustrated by FIGS. 2B and 2C, the nitride or oxynitride layer in various dual dielectric layer sidewall spacer implementations may be doped with deuterium to provide a deuterium source for passivation of interface traps.

In certain embodiments including both a deuterated gate cap layer and deuterated sidewall spacers, as shown in FIG. 2B and FIG. 2C, the gate stack of the of semiconductor devices is encapsulated on the top and sidewalls with deuterated layers. This encapsulation with deuterated layers provides deuterium sources that are advantageously proximate to the interface traps both within the gate stack and on the surface of the gate stack. The close proximity of these deuterium sources focuses the diffusion of the deuterium species from the sources in both the upper layer of the gate stack and the gate stack sidewall spacers toward the performance limiting interface traps encapsulated therein. The close proximity of these deuterium sources further reduces the thermal budget required for the deuterium passivating species to diffuse to a particular interface trap.

Other embodiments not explicitly depicted in FIGS. 2A-2D include an incorporation of deuterium into any combination of these three regions, such as a deuterated gate layer and deuterated gate stack sidewall spacers with a non-deuterated gate cap layer. Similarly, in other embodiments, a SONOS-type device may employ a deuterated gate layer and non-deuterated sidewall spacers. In such embodiments employing a deuterated gate layer, the gate cap layer, if present, may be non-deuterated. In further embodiments, deuterated gate stack sidewall spacers are employed in combination with a non-deuterated gate layer and, if present, a non-deuterated gate cap layer. Thus, while the embodiments in FIGS. 2A-2D depict four exemplary implementations, it should be appreciated other embodiments employing a number of other combinations are possible.

As further depicted in FIGS. 2A-2D, the SONOS devices 201-204, respectively, are covered with ILD 238 for isolation to facilitate subsequent metallization to source and drains regions 226 with conventional contact/via/trench formation and fill. In one embodiment, a non-deuterated ILD 238 is advantageously employed because the SONOS devices are encapsulated with one or more deuterated layers, such as a deuterated gate layer, a deuterated gate cap layer and a deuterated sidewall spacer or a deuterated spacer liner. A non-deuterated ILD 238 may comprise dielectrics having a lower dielectric constant than silicon nitride to lower interconnect capacitance and be compatible with CMOS backend materials. In one particular embodiment, ILD 238 is silicon dioxide which can be either undoped or doped with Phosphorus and Boron. In another embodiment, ILD 238 is a conventional low-k material having a dielectric constant lower than silicon dioxide, such as, but not limited to carbon-doped oxide (CDO), fluorine-dope oxide and porous oxide.

Figure 3A:
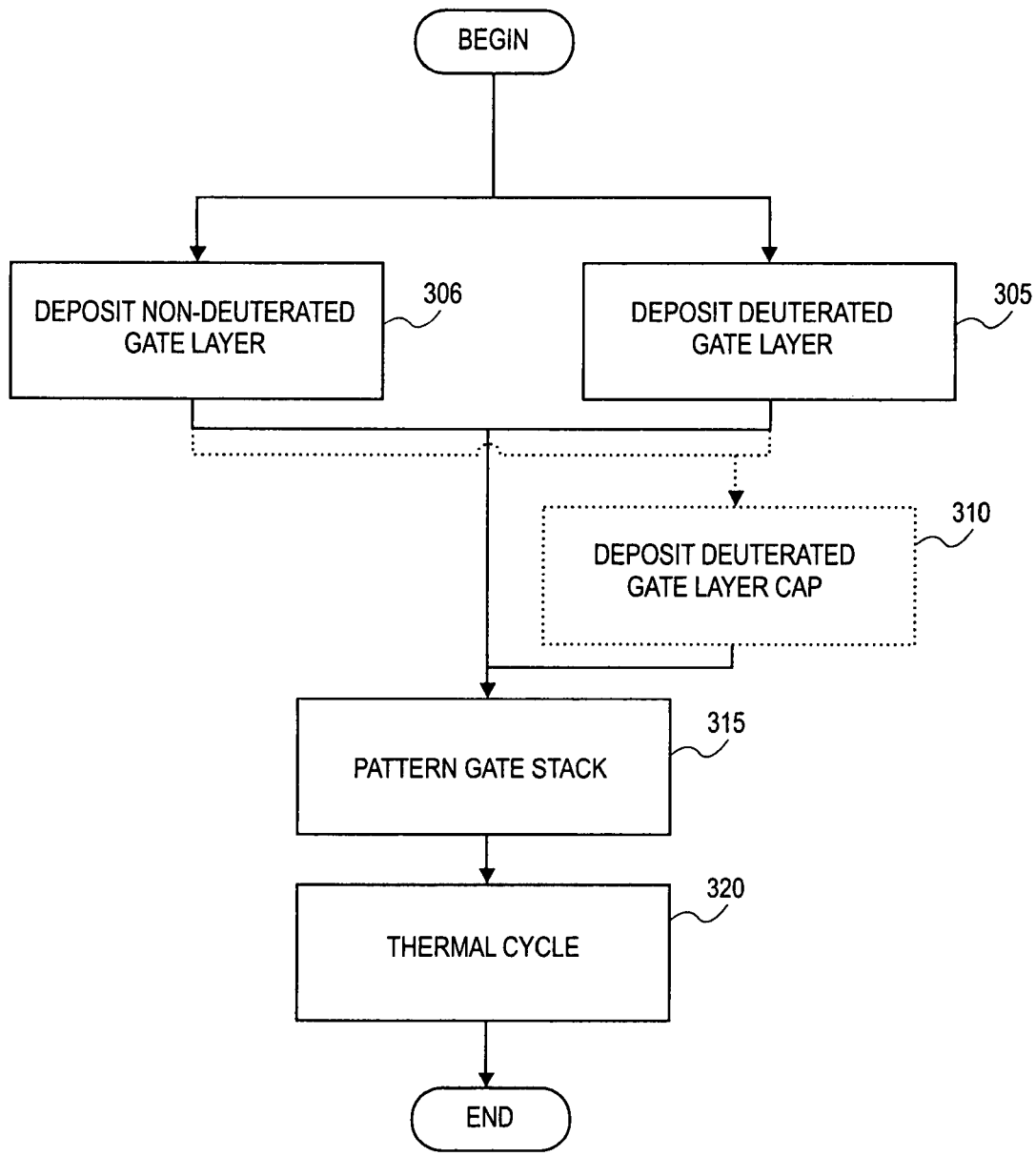
FIG. 3A is a flow chart of a method forming a SONOS device including a deuterated gate layer and a deuterated gate cap layer according to embodiments of the present invention.

FIG. 3a is a flow chart of methods for forming a nonvolatile charge trap memory device including a deuterated gate layer or a deuterated gate cap layer according to embodiments of the present invention. The depicted embodiment begins with a gate stack dielectric on a substrate, such as the ONO stack 220 on substrate 212 of FIG. 2A-2D, formed using commonly known techniques. On the gate stack dielectric, a gate layer is deposited. In one embodiment, at operation 305, a deuterated gate layer is formed on the ONO stack 220. The deuterated gate layer may be formed using any commonly known deuterated precursor depending on the particular gate layer material, which may be any of those materials described elsewhere herein. In one embodiment, a deuterated poly-silicon gate layer is deposited with a $SiD_4$ precursor gas in a chemical vapor deposition process (CVD) performed at a temperature of between 530° C. and 650° C. and preferably between 530° C. and 550° C. to a thickness within the range described elsewhere herein. In other embodiments $SiD_2Cl_2$ is employed. In an alternate embodiment, other commonly known gate layer materials, such as gate metals, are deposited using conventional deposition techniques such as physical vapor deposition (PVD) with a deuterated target or in a deuterated ambient and plasma enhanced CVD (PECVD) employing a deuterated source gas.

In an alternative embodiment, as further shown in FIG. 3A, a non-deuterated gate layer, such as depicted in FIGS. 2A-2C, may be formed at operation 306. For example, in one particular embodiment, a non-deuterated poly-silicon gate layer is deposited using a conventional deposition process employing a hydrogenated source or precursor gas, such as silane, dichlorosilane, etc.

Following operation 305 (or alternatively operation 306), a deuterated gate cap layer as depicted in FIGS. 2A-2D, may be deposited at operation 310. In an embodiment, a deuterated gate cap layer is deposited using a deposition process employing a deuterated source gas, such as $ND_3$ or $D_2$. In further embodiments, a CVD process, such as a low pressure process (LPCVD), using an ambient including $ND_3$ may be employed along with a hydrogenated silicon source gas, such as silane ($SiH_4$), dichlorosilane ($SiH_2Cl_2$), or bis(tertiary-butylamino) silane (BTBAS), for example, to form a deuterated silicon nitride gate cap layer. In further embodiments, a deuterated silicon source gas, such as, but not limited to, $SiD_4$ and $SiD_2Cl_2$, may also be employed with or without a deuterated nitrogen source gas such as $ND_3$. The CVD deposition of deuterated silicon nitride gate cap layer may be performed at a substrate temperature between approximately 550° C. and approximately 750° C. at a deposition chamber pressure between approximately 100 millitorr (mT) and approximately 200 mT to form a film having a thickness anywhere within the ranges described elsewhere herein. Typically, the deposition temperature is made higher for non-BTBAS embodiments for an appreciable deposition rate. Generally, the concentration of deuterium into the gate cap layer depends on the film quality with higher deuterium concentrations possible in lower quality films. In one exemplary silicon nitride deposition process, a higher concentration of deuterium is incorporated by depositing the film at lower substrate temperature. In a particular embodiment, the deuterated source gas is mixed with a non-deuterated source gas at different rates during the course of the deposition of a gate cap layer to tailor the concentration of the deuterium. One such embodiment provides a high initial deuterated source gas partial pressure which is gradually decreased as deposition time proceeds. In a further embodiment, the deposition parameters are modified to improve the quality of the nitride while the deposition time proceeds and the deuterium concentration declines. Such an embodiment may advantageously provide an outdiffusion barrier to the deuterium incorporated in the bottom portion of the deuterated gate cap layer. Deposition times may be readily determined by one of ordinary skill in the art because the deposition rates with deuterated source gases are only slightly lower than those with non-deuterated source gases.

In an alternate embodiment, a non-deuterated gate cap layer may be formed with commonly known techniques employing hydrogenated gases, such as, but not limited to BTBAS, $SiH_4$, $SiH_2Cl_2$, $N_2O$, $NH_3$ and $O_2$. The non-deuterated gate cap layer may be formed on either the deuterated or non-deuterated gate layer formed in operations 305 or 306, respectively. In still another embodiment, no gate cap layer is formed at all and thus operation 310 may optionally be skipped entirely, as denoted by the dashed lines in FIG. 3A.

The method depicted in FIG. 3A then proceeds with patterning of the gate stack in operation 315. Conventional patterning techniques may be employed at operation 315, such as lithographic mask definition followed by commonly known plasma or wet etching of the dielectric stack, gate layer and gate cap layer to form the gate stack. Upon formation of the gate stack, the particular embodiment depicted in FIG. 3A proceeds with a thermal cycle at operation 320. In one embodiment, the thermal cycle of operation 320 is performed for 60 to 90 minutes at approximately 900° C. In one particular embodiment, the deuterium species is diffused from a deuterated gate layer or deuterated gate cap layer into the interfaces of an ONO stack by performing a poly-silicon re-oxidation (poly reox) process at operation 320. In other embodiments, the thermal cycle at operation 320 is distinct from a poly reox operation. For example, if diffusion beyond that achievable by a particular poly reox operation is desired, a subsequent thermal process may be employed to augment that provided by the poly reox operation. In other embodiments not employing a poly reox, such as those employing a metal gate electrode, the thermal cycle of operation 320 may be performed to achieve diffusion of the deuterium into the interfaces of the ONO stack 220. Exemplary embodiments include a rapid thermal anneal for between 30 seconds and 5 minutes at a temperature between approximately 700° C. and approximately 900° C. and a furnace anneal for 60 to 90 minutes at approximately 900° C. In still other embodiments, the thermal cycle of operation 320 may be skipped in favor of alternate thermal cycle performed after further encapsulation of the gate stack.

Figure 3B:
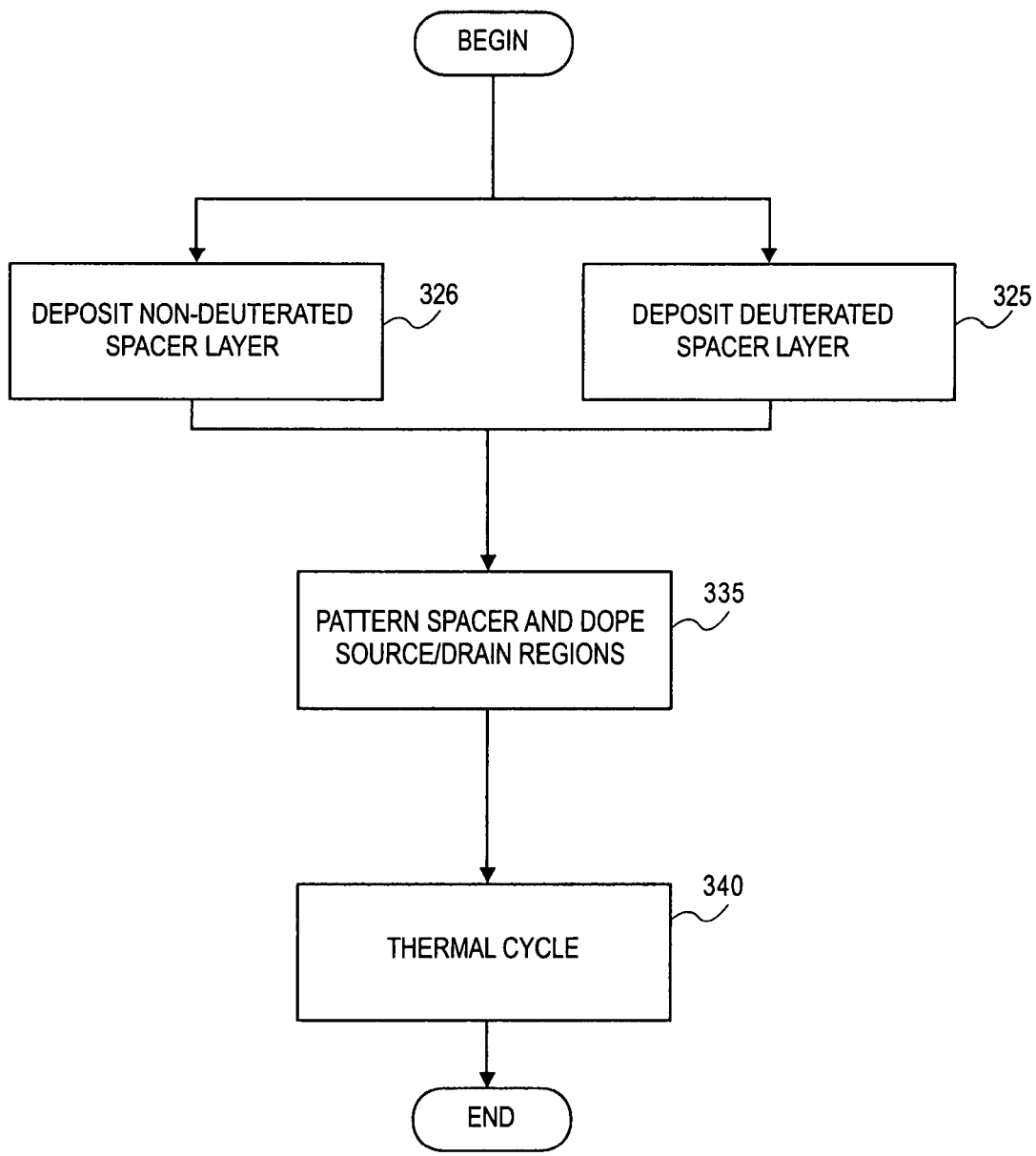
FIG. 3B is a flow chart of a method forming a SONOS device including deuterated gate stack sidewall spacers according to certain embodiments of the present invention.

FIG. 3B is a flow chart of methods for forming a SONOS device including deuterated gate stack sidewall spacers according to an embodiment of the present invention. The depicted embodiment begins with a gate stack on a substrate, such as that provided by the methods depicted in FIG. 3A. It should be appreciated however, that operations in addition to those described in FIG. 3A, such as lightly doped drain (LDD) formation, may also have been performed on the work piece prior to beginning the methods described in FIG. 3B. In one embodiment, at operation 326, a non-deuterated spacer layer is deposited over a gate stack or over a spacer liner layer. Such non-deuterated spacer layers may be employed in certain embodiments where a deuterated gate layer or a deuterated gate cap layer is formed by the methods depicted in FIG. 3A. A non-deuterated spacer layer may be formed by any technique commonly known in the art.

In alternative embodiments, a deuterated spacer layer is deposited and formed at operation 325. Operation 325 is expanded in FIG. 3C. In one embodiment, at operation 326 a deuterated spacer layer is deposited using a deposition process employing a deuterated source gas, such as $ND_3$. In particular embodiments, a CVD process, such as a low pressure process (LPCVD), using an ambient including $ND_3$ may be employed along with a hydrogenated silicon source gas, such as silane, dichlorosilane, or bis(tertiary-butylamino)silane (BTBAS), to form a deuterated silicon nitride spacer layer, for example. In further embodiments, a deuterated silicon source gas, such as $SiD_4$ and $SiD_2Cl_2$, may also be employed with or without a deuterated nitrogen source gas such as $ND_3$. The CVD deposition of a deuterated silicon nitride spacer layer may be performed at a substrate temperature between approximately 550° C. and approximately 750° C. at a deposition chamber pressure between approximately 100 mT and approximately 200 mT to form a film having a thickness in a range between approximately 50 nm and 80 nm thick. Typically, the deposition temperature is made higher for non-BTBAS embodiments for an appreciable deposition rate. Generally, the concentration of deuterium into the gate cap layer depends on the film quality with higher deuterium concentrations possible in lower quality films. In one exemplary silicon nitride deposition process, a higher concentration of deuterium is incorporated by depositing the film at lower substrate temperature. In a particular embodiment, the deuterated source gas is mixed with a non-deuterated source gas at different rates during the course of the deposition of the deuterated spacer layer to tailor the concentration of the deuterium. One such embodiment provides a high initial deuterated source gas partial pressure which is gradually decreased as deposition time proceeds. In a further embodiment, the deposition parameters are modified to improve the quality of the nitride while the deposition time proceeds and the deuterium concentration declines. Such an embodiment may advantageously provide an outdiffusion barrier to the deuterium incorporated in the bottom portion of the deuterated spacer layer.

In an alternative embodiment, operation 327 a deuterated spacer liner is formed over the gate stack, such as depicted in FIG. 2C. The deuterated spacer liner may be formed in accordance with the any of the methods described for operation 326 of FIG. 3C. Following operation 327, at operation 329 a non-deuterated spacer layer is deposited on the deuterated spacer liner. The non-deuterated spacer layer may be of any commonly employed spacer material, such as, but not limited to, silicon dioxide, silicon oxynitride and silicon nitride. The non-deuterated spacer layer may advantageously serve as an outdiffusion barrier to block the outdiffusion of deuterium during a subsequent thermal cycle.

In still another embodiment, at operation 328 a non-deuterated spacer liner is deposited with commonly known techniques, such as CVD. In one embodiment, a non-deuterated silicon dioxide is deposited. Following operation 328, a deuterated spacer layer is deposited on the spacer liner at operation 330. The deuterated spacer liner may be formed in accordance with the any of the methods described for operation 326. Similarly, in other dual-layer spacer implementations, both the spacer liner and the spacer layer may be deuterated.

Figure 3C:
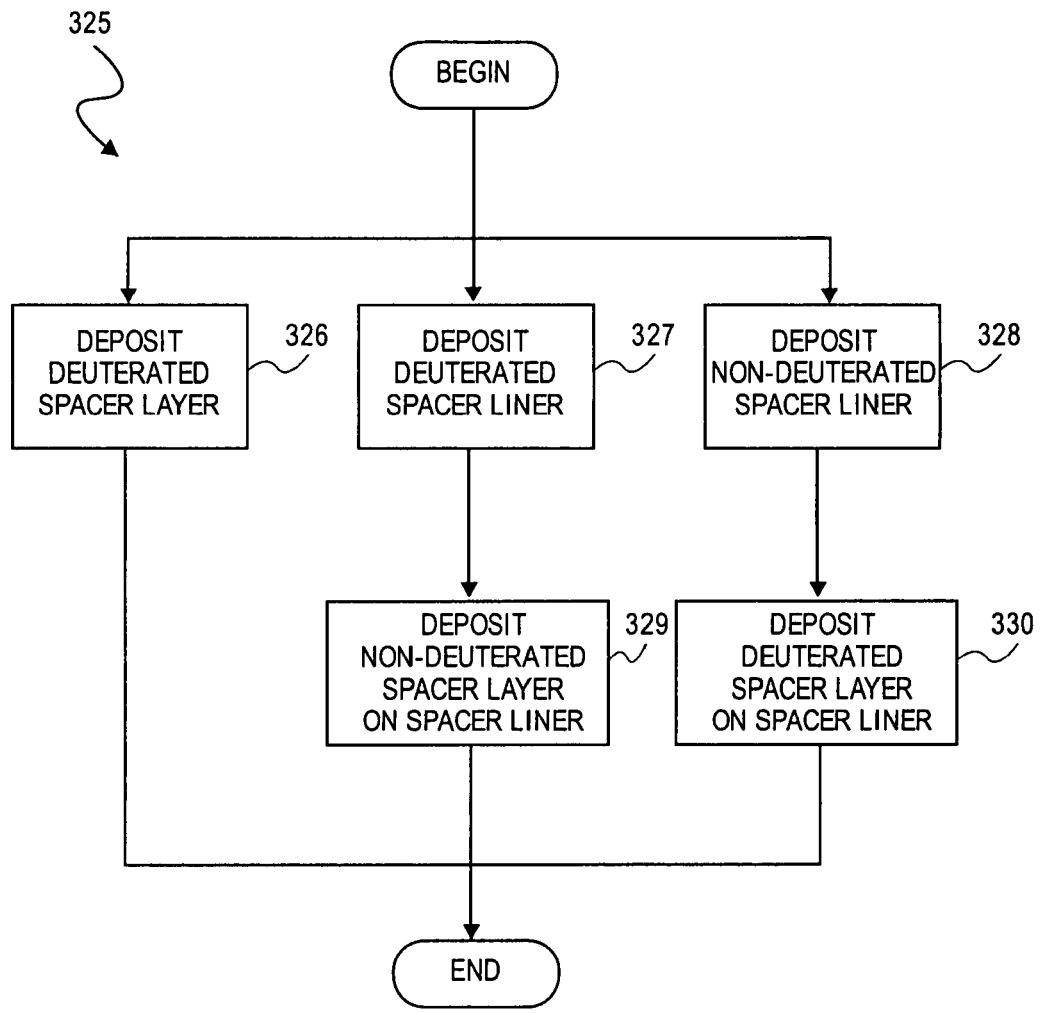
FIG. 3C is a flow chart of a method forming deuterated gate stack sidewall spacers according to certain embodiments of the present invention.

With the completion of any of the methods depicted in FIG. 3C, the method depicted in FIG. 3B may continue. Following formation of the deuterated or non-deuterated spacer layer at operation 325 or 326, respectively, the spacer layer is patterned into sidewall spacers using commonly employed self-aligned anisotropic etching techniques. Similarly, at operation 335, other conventional fabrication operations, such as source or drain formation, are performed. A thermal cycle is then performed at operation 340 to diffuse the deuterium species from the as-deposited spacer layer(s) including deuterium into the interfaces of the gate dielectric stack, such as ONO stack 220 of FIGS. 2A-2D. In one particular embodiment, the source or drain activation anneal may be employed for the additional purpose of diffusing the deuterium species from deuterated sidewall spacers into the semiconductor device gate stack. In one such embodiment, the activation anneal is a rapid thermal anneal (RTA) performed at 900° C. to 1000° C. in an argon ambient for 10 sec to 60 seconds. In an alternative embodiment, the thermal cycle of operation 340 is distinct from that of the activation anneal. With the methods depicted in FIG. 3A, FIG. 3B and FIG. 3C substantially complete, fabrication of a deuterium passivated nonvolatile charge trap memory device, such as the SONOS devices 201-204 of FIGS. 2A-2D, may proceed with conventional backend processing operations, such as but not limited to silicide formation, deposition of ILD, such as ILD 238, and metallization.

Figure 4A:
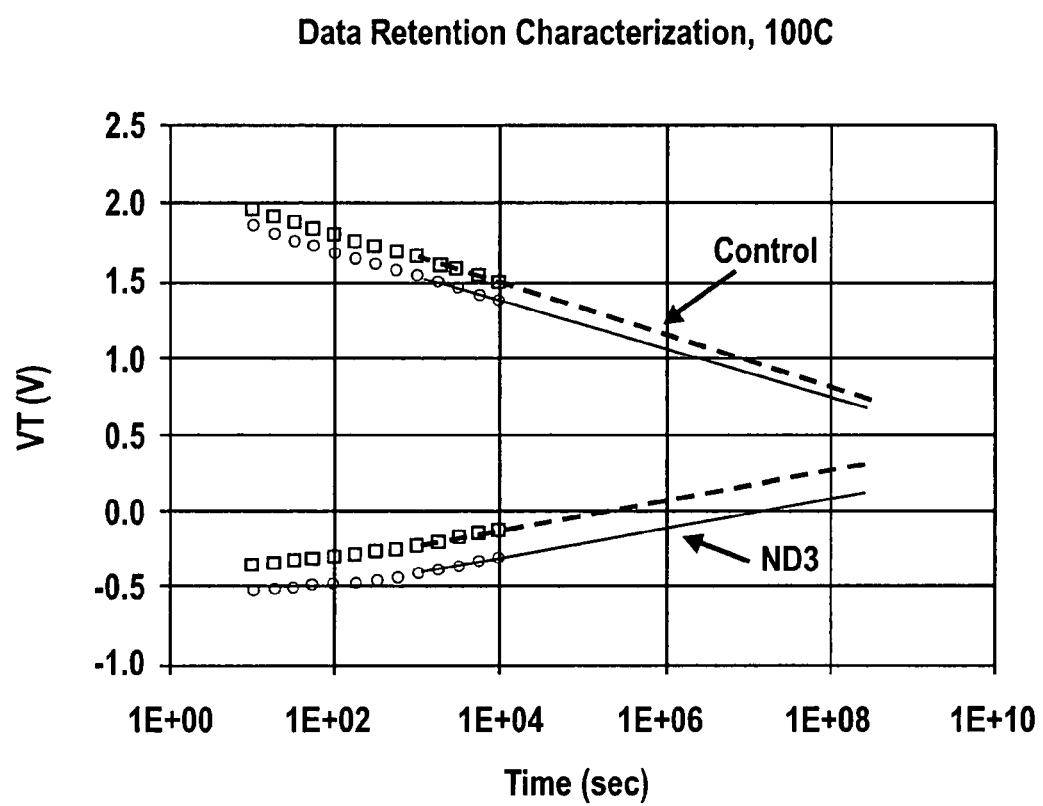
FIG. 4A is a comparison of retention time in a SONOS device including a deuterated gate cap layer and deuterated gate stack sidewall spacers according an embodiment of the present invention to retention time in a conventional SONOS device.

FIG. 4A provides a 100° C. data retention performance for the "ND$_3$" SONOS device including a deuterated nitride gate cap layer and deuterated nitride gate stack sidewall spacers in accordance with the methods described herein. Also depicted is 100° C. data retention performance for the "control" SONOS device having a non-deuterated gate, a non-deuterated gate cap layer and non-deuterated gate stack sidewall spacers. As shown, the "ND3" SONOS device has an end of life (EOL) window that is approximately 140 mV larger than that of the "control," thereby providing a better sensing margin.

Figure 4B:
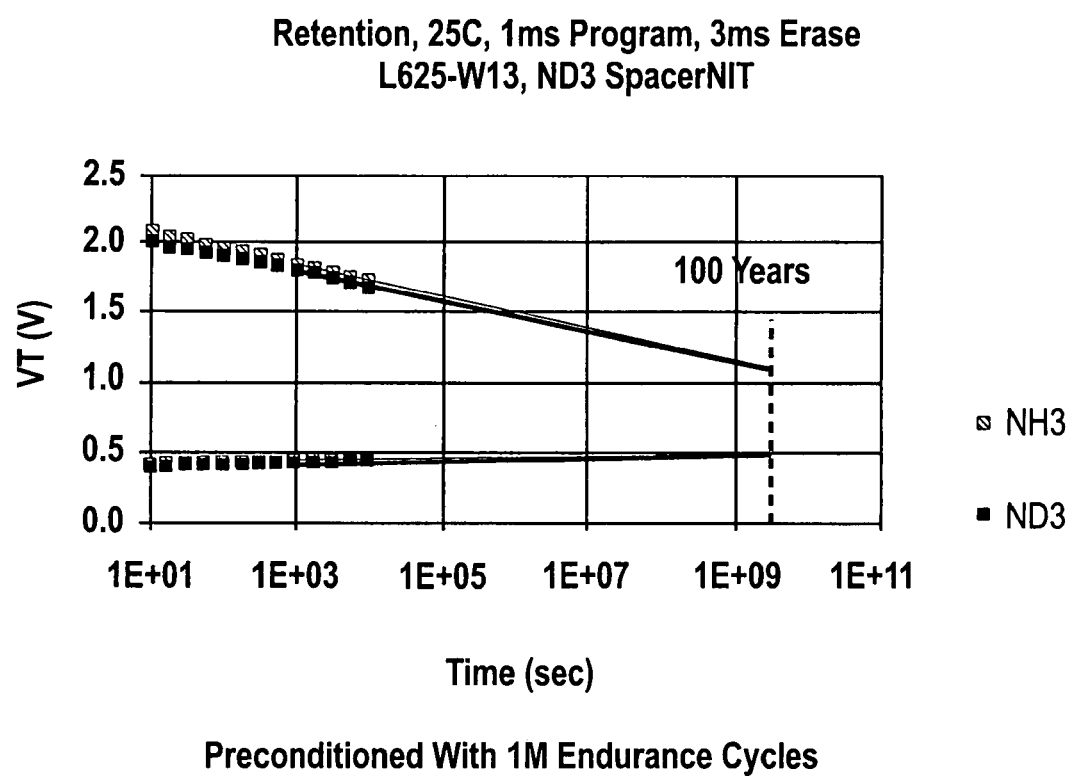
FIG. 4B is a comparison of retention time for a SONOS device including a deuterated gate cap layer and deuterated gate stack sidewall spacers according an embodiment of the present invention to retention time for a conventional SONOS device.

FIG. 4B provides room temperature data retention performance after 1 million 1 ms program and 3 ms erase cycles for the "ND$_3$" SONOS device including a deuterated nitride gate cap layer and deuterated nitride gate stack sidewall spacers in accordance with the methods described herein. The same performance data is plotted for the "NH$_3$" SONOS device having a non-deuterated gate, a non-deuterated gate cap layer and non-deuterated gate stack sidewall spacers. As shown, the "ND$_3$" SONOS device has a lower program decay rate than the "NH$_3$" control device.

Figure 4C:
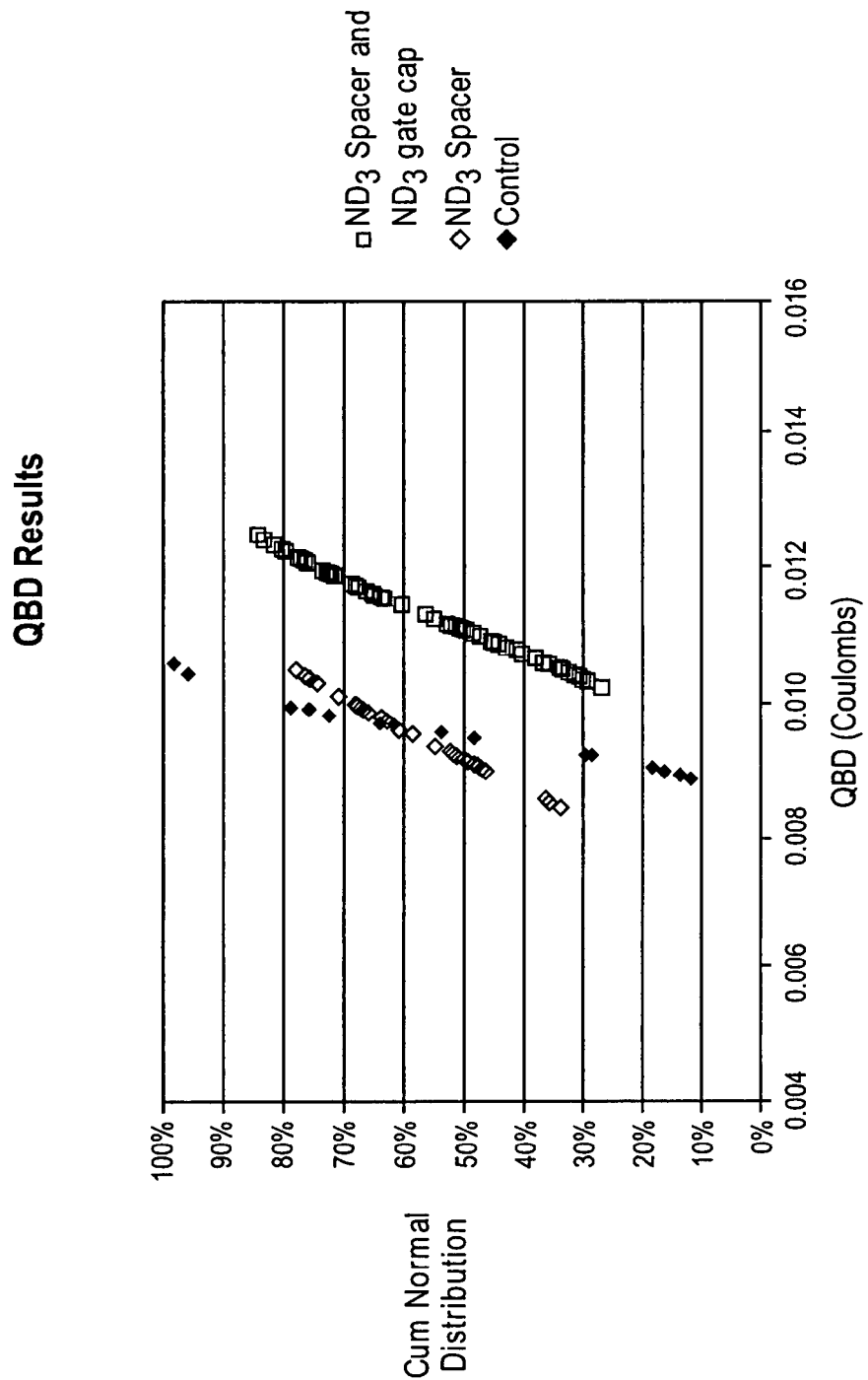
FIG. 4C provides charge to break down (QBD) performance for various treatments including a SONOS device having a deuterated gate cap layer and a SONOS device having a deuterated gate cap layer and a deuterated gate stack sidewall spacers according an embodiment of the present invention.

FIG. 4C provides charge to break down (QBD) performance for various treatments. A higher QBD indicates the gate stack films results from the deuterium treatments disclosed herein are able to better resist breakdown and therefore are of a higher quality. As shown, the "control" treatment having neither a deuterated gate cap nor a deuterated spacer, provides a QBD between 0.009 coulombs and 0.010 coulombs. The "ND$_3$ spacer and ND$_3$ gate cap" treatment, having both a deuterated silicon nitride gate cap layer and a deuterated silicon nitride spacer, has a substantially improved QBD of between 0.010 coulombs and 0.013 coulombs. The "ND$_3$ spacer" treatment, having a deuterated silicon nitride spacer but not a deuterated silicon nitride gate cap layer, shows QBD performance similar to the control. This illustrates some advantage to embodiments employing a deuterated gate cap.

FIG. 4D provides an end of life (EOL) window comparison of the same three treatments described in FIG. 4C. As shown, the EOL window of the deuterated spacer treatment is improved approximately 0.075 V relative to the control. The improvement in the EOL window of the "ND$_3$ spacer and ND$_3$ gate cap" is improved even more, increase the EOL window by approximately 0.15 V over the control.

Figure 4E:
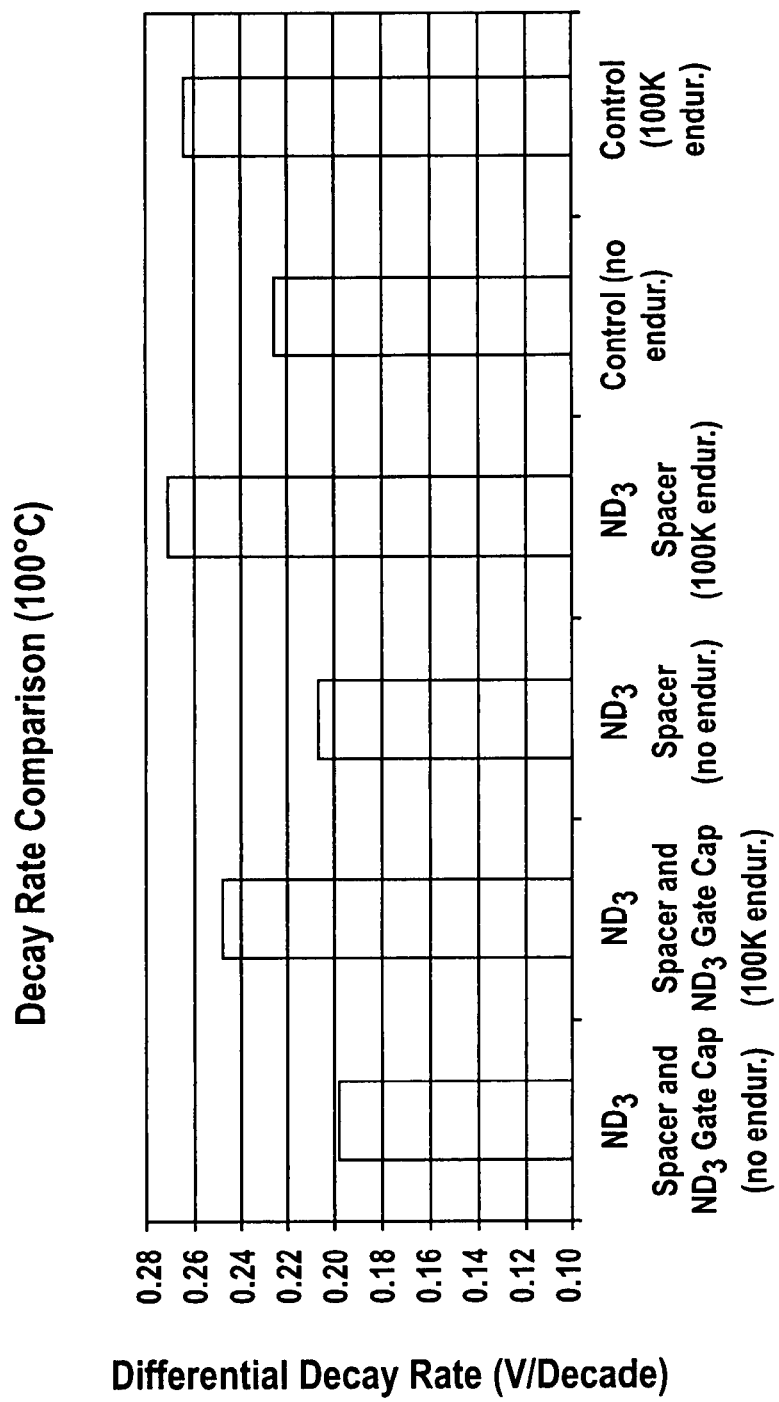
FIG. 4E provides threshold voltage ($V_t$) decay rate performance for various treatments including a SONOS device having a deuterated gate cap layer and a SONOS device having a deuterated gate cap layer and a deuterated gate stack sidewall spacers according an embodiment of the present invention.

FIG. 4E provides a threshold voltage (V$_t$) decay rate comparison measured at 100° C. for the same three treatments described for FIG. 4C. For each treatment, a first decay rate of an unstressed device, labeled "no endur." is provided along with a second decay rate of the same device after stressing with a 100,000 program/erase cycles, labeled "100K endur." As shown, the treatment having both deuterated silicon nitride spacers and deuterated silicon nitride gate cap have the lowest decay rates both before and after stressing the device.

It should be appreciated that although shown and described as part of a SONOS stack in a SONOS memory device, the method of the present invention is not so limited, and the passivation technique can be used in or with any semiconductor technology or in any device requiring susceptible to the presence of interface trap states including, for example, in a split gate flash memory, a TaNOS stack, in a 1T (transistor) SONOS cell, a 2T SONOS cell, a 3T SONOS cell, a localized 2-bit cell, a multilevel programming or cell, a CMOS transistor, and a III-V heterojunction transistor or optical device without departing from the scope of the invention.

Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of fabricating a nonvolatile charge trap memory device, comprising:
   forming sequentially on a substrate a tunneling layer, a charge retention layer, a blocking layer, and a gate layer;
   forming on the gate layer a deuterated gate cap layer;
   etching the deuterated gate cap layer and the tunneling layer into a gate stack;
   forming a gate stack spacer adjacent to a sidewall of the gate stack; and
   forming an interlayer dielectric layer on the gate stack and the gate stack spacer, the gate cap layer having a higher deuterium concentration at an interface with the gate layer than at an interface with the interlayer dielectric layer.

2. The method of claim 1, wherein forming on the gate layer a deuterated gate cap layer further comprises depositing silicon nitride with $ND_3$.

3. The method of claim 1, wherein depositing a deuterated gate stack spacer layer adjacent to the gate stack further comprises:
depositing a first dielectric film and a second dielectric film on the first dielectric film, wherein the second dielectric film is a silicon nitride formed with $ND_3$.

4. The method of claim 3, wherein the silicon nitride is further formed with a deuterated silicon precursor gas.

5. The method of claim 1, wherein forming a gate layer further comprises depositing a silicon film with a deuterated silicon precursor gas.

6. The method of claim 1, further comprising:
diffusing deuterium from the gate cap layer into at least the blocking layer with an elevated temperature anneal performed after formation of the gate stack and prior to deposition of a gate stack spacer layer.

7. A method comprising:
forming on a substrate a gate stack between a source and drain region, the gate stack including a tunneling layer, a trapping layer, a blocking layer, a gate layer, and a deuterated gate cap layer;
forming a gate stack spacer adjacent to a sidewall of the gate stack; and
forming an interlayer dielectric layer on the gate stack and the gate stack spacer, the gate cap layer having a higher deuterium concentration at an interface with the gate layer than at an interface with the interlayer dielectric layer.

8. The method of claim 7, wherein the deuterated gate cap layer comprises deuterated silicon nitride.

9. The method of claim 7, wherein forming the gate stack spacer comprises forming a deuterated gate stack spacer.

10. The method of claim 9, wherein forming the deuterated gate stack spacer comprises forming a first dielectric layer adjacent to the sidewall of the gate stack and forming a second dielectric layer on the first dielectric layer and at least one of the first dielectric layer and the second dielectric layer comprises deuterated silicon nitride.

11. The method of claim 10, wherein the first dielectric layer comprises deuterated silicon nitride and the second dielectric layer is non-deuterated.

12. The method of claim 7, wherein the gate layer is deuterated and has a concentration of deuterium greater near an interface with the blocking layer than near the interface with the gate cap layer.

13. The method of claim 12, wherein the gate layer is deuterated silicon.

14. The method of claim 12, wherein the deuterated gate layer comprises a lower concentration of deuterium than does the deuterated gate cap layer.

15. The method of claim 7, wherein the deuterated gate cap layer has a higher deposited deuterium concentration at the interface with the gate layer than at the interface with the interlayer dielectric layer.

16. A method comprising:
forming a gate stack comprising a gate layer and a deuterated gate cap layer on the gate layer;
forming a deuterated gate stack spacer adjacent to a sidewall of the gate stack, wherein the deuterated gate stack spacer includes a first dielectric layer and a second dielectric layer on the first dielectric layer and at least one of the first dielectric layer and the second dielectric layer comprises deuterated silicon nitride; and
forming an interlayer dielectric layer on the gate stack and on the gate stack spacer, wherein a deuterium concentration throughout the thickness of the deuterated silicon nitride layer has a gradient with a higher deuterium concentration proximate to the sidewall of the gate stack than proximate to the interlayer dielectric layer.

17. The method of claim 16, wherein the deuterium concentration in the gate stack is highest in the deuterated gate cap layer.

18. The method of claim 16, wherein the deuterated gate stack spacer has a higher concentration of deuterium than the interlayer dielectric layer.

19. The method of claim 16, wherein the at least one of the first dielectric layer and the second dielectric layer comprising deuterated silicon nitride proximate to the gate stack has a deuterium concentration that is substantially the same as the deuterium concentration in a region proximate to the interlayer dielectric.

20. The method of claim 16, wherein forming the gate stack comprises forming a tunneling layer on a substrate, a trapping layer on the tunneling layer, a blocking layer on the trapping layer, and the gate layer on the blocking layer, and the deuterated gate cap layer on the gate layer.

* * * * *